(12) United States Patent  
Nagamitsu et al.

(10) Patent No.: US 11,373,875 B2  
(45) Date of Patent: Jun. 28, 2022

(54) PLASMA PROCESSING METHOD

(71) Applicant: Hitachi High-Tech Corporation, Tokyo (JP)

(72) Inventors: Yusuke Nagamitsu, Tokyo (JP); Takeshi Shima, Tokyo (JP); Takeshi Shimada, Tokyo (JP); Hayato Watanabe, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/957,835

(22) PCT Filed: Jun. 21, 2019

(86) PCT No.: PCT/JP2019/024708  
§ 371 (c)(1),  
(2) Date: Jun. 25, 2020

(87) PCT Pub. No.: WO2020/100338  
PCT Pub. Date: May 22, 2020

(65) Prior Publication Data  
US 2021/0066087 A1    Mar. 4, 2021

(51) Int. Cl.  
*H01L 21/3065* (2006.01)  
*H01L 21/02* (2006.01)  
*H01L 21/8234* (2006.01)  
*H01L 21/762* (2006.01)

(52) U.S. Cl.  
CPC .. *H01L 21/30655* (2013.01); *H01L 21/02238* (2013.01); *H01L 21/02252* (2013.01); *H01L 21/823481* (2013.01); *H01L 21/76224* (2013.01); *H01L 21/823431* (2013.01)

(58) Field of Classification Search  
CPC ......... H01L 21/30655; H01L 21/02238; H01L 21/02252; H01L 21/76224; H01L 21/823431; H01L 29/66795; H01L 29/78  
See application file for complete search history.

(56) References Cited

U.S. PATENT DOCUMENTS

| | | |
|---|---|---|
| 2013/0026539 A1 | 1/2013 | Tang et al. |
| 2014/0302682 A1* | 10/2014 | Muto ................ H01J 37/32715 438/711 |
| 2016/0300725 A1 | 10/2016 | Ambati et al. |

FOREIGN PATENT DOCUMENTS

| | | |
|---|---|---|
| JP | 2001110783 A | 4/2001 |
| JP | 2010287823 A | 12/2010 |
| JP | 2013030776 A | 2/2013 |

(Continued)

OTHER PUBLICATIONS

Machine Translation JP 2015-05440.*

(Continued)

*Primary Examiner* — Julia Slutsker  
(74) *Attorney, Agent, or Firm* — Miles & Stockbridge, P.C.

(57) ABSTRACT

There is provided a plasma processing method for forming shallow trench isolation (STI) on a silicon substrate, the plasma processing method including: a trench forming step of forming a trench in the silicon substrate by using plasma generated by pulse-modulated radio frequency power; and an oxidation step of oxidizing the silicon substrate by using only oxygen gas which is performed after the trench forming step, in which the trench forming step and the oxidizing step are repeated a plurality of times.

17 Claims, 5 Drawing Sheets

(56) References Cited

FOREIGN PATENT DOCUMENTS

| | | | |
|---|---|---|---|
| JP | 2014204050 | A | 10/2014 |
| JP | 2014220360 | A | 11/2014 |
| JP | 2015050440 | A | 3/2015 |

OTHER PUBLICATIONS

Search Report dated Sep. 17, 2019 in corresponding International Application No. PCT/JP2019/024708.
Office Action dated Feb. 8, 2021 in Taiwanese Application No. 109114150.
Office Action dated Aug. 3, 2021 in Japan Application No. 2020-520673.
H. V. Jansen "Black silicon method XI: Oxygen pulses in SF6 plasma" Journal of Micromechanics and Microengineering, Jun. 2010, vol. 20, pp. 1-5.

* cited by examiner

PLASMA PROCESSING METHOD

TECHNICAL FIELD

The present invention relates to a plasma processing method.

BACKGROUND ART

In recent years, miniaturization of semiconductors has been promoted, which has affected a structure of a device. For example, in a transistor structure of related art, a decrease in threshold voltage due to a short channel effect between a source and a drain due to a reduction in gate length cannot be ignored. Therefore, a fin-field effect transistor (Fin FET) structure called a Fin (hereinafter also referred to as a fin), in which a source electrode and a drain electrode are provided on side walls of a gate electrode is used.

In a general Fin FET, a source electrode and a drain electrode are formed by performing ion implantation in a Fin crossing a polysilicon gate electrode, and a driving current of the transistor is controlled. At this time, when a desired Fin height is not obtained, an area of the Fin is reduced, which causes a decrease in the driving current of the transistor. Further, when roughness occurs in a side wall shape of the Fin, a device performance is deteriorated. Therefore, the side wall of the Fin is required to have a shape as close to vertical as possible.

On the other hand, in a field of manufacturing semiconductors, shallow trench isolation (hereinafter abbreviated as an STI) is used as an element isolation technique. In the STI, a trench (also referred to as an etching groove) is formed in a silicon substrate by, for example, anisotropic etching. Then, a fin can be formed by combining the trenches.

In a general silicon substrate, a region where a trench width is relatively narrow and trenches are provided relatively densely (hereinafter abbreviated as a dense pattern) and a region where a trench width is wide and trenches are provided relatively sparsely (hereinafter abbreviated as a sparse pattern) are formed.

In a process of forming the trenches on the silicon substrate by etching, it is necessary to perform etching so that the depth and the shape of the trenches are the same in the dense pattern and the sparse pattern so as to secure stable device performance. However, when etching a silicon substrate in which a dense pattern and a sparse pattern are mixed, an etching rate in the dense pattern is slow, and an etching rate in the sparse pattern is fast, so that a uniform trench depth cannot be obtained. Such a phenomenon is referred to as sparse and dense micro-loading.

Further, as described above, in a device having the Fin FET structure, a silicon side wall of the Fin is required to have a shape as close to vertical as possible.

PTL 1 discloses a technique of forming trenches having a predetermined depth in a silicon substrate by repeating a first step, a second step and a third step for a plurality of times. More specifically, an etching is performed using $Cl_2$ gas in the first step, a deposit deposited on a side surface of the trench is removed by Ar gas and $CF_4$ gas in the second step, and the side surface of the trench and a bottom surface of the trench are oxidized by mixed gas of $O_2$ gas and Ar gas in the third step. Further, it is also disclosed that sparse and dense micro-loading is reduced by repeating the above three steps for a plurality of times.

Further, PTL 2 discloses, as a method of applying pulse modulated power, a plasma etching method in which plasma is controlled by pulse modulation and a substrate bias is controlled so that pulsed power is superimposed on continuous power.

PRIOR ART LITERATURE

Patent Literature

PTL 1: JP-A-2015-50440
PTL 2: JP-A-2014-220360

SUMMARY OF INVENTION

Technical Problem

Sparse and dense micro-loading can be reduced by etching a silicon substrate provided with a hard mask on an upper surface thereof by a technique disclosed in PTL 1. However, since processing disclosed in PTL 1 includes the second step, roughness may be generated in a silicon side wall of a Fin.

Figure 4:
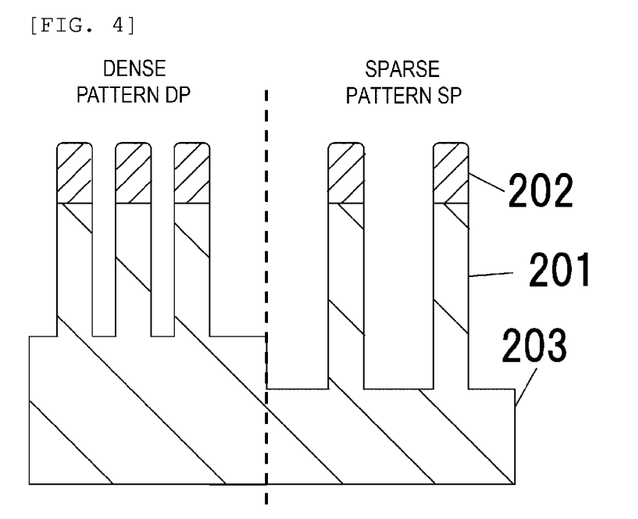
FIG. 4 is a cross-sectional view of a main part of the same part as shown in FIG. 2 during a semiconductor manufacturing process according to a technique of related art.

A shape after etching using the technique disclosed in PTL 1 is shown in FIG. 4. The second step disclosed in PTL 1 is a process in which Ar gas and $CF_4$ gas are used, and is performed for the purpose of removing a reaction product of a silicon system. However, fluorine is involved in the etching of a silicon side wall 201 of a Fin, causing roughness (unevenness) as shown in FIG. 4.

In order to reduce the roughness of the silicon side wall 201, it is necessary to repeatedly perform etching without the second step, which results in insufficient reduction of the deposit attached by the first step.

On the other hand, PTL 2 discloses a step of removing a deposited film deposited inside a groove by plasma using mixed gas of nitrogen trifluoride gas and oxygen gas. However, it is not preferable to additionally execute such a step because a processing time becomes long.

An object of the invention is to provide a plasma processing method capable of reducing sparse and dense micro-loading while reducing roughness of a silicon side wall in etching a silicon substrate.

Solution to Problem

In order to solve the above problems, typically, the invention provides a plasma processing method for forming shallow trench isolation (STI) on a silicon substrate, the plasma processing method including: a trench forming step of forming a trench in the silicon substrate by using plasma generated by pulse-modulated radio frequency power; and an oxidation step of oxidizing the silicon substrate by using only oxygen gas which is performed after the trench forming step, in which the trench forming step and the oxidizing step are repeated a plurality of times.

Advantageous Effect

According to the invention, a plasma processing method capable of achieving both a reduction in roughness of a silicon side wall and a reduction in sparse and dense micro-loading in etching of a silicon substrate can be provided.

Problems, configurations and effects other than those described above will be clarified by description of the following embodiments.

DESCRIPTION OF EMBODIMENTS

Figure 1:
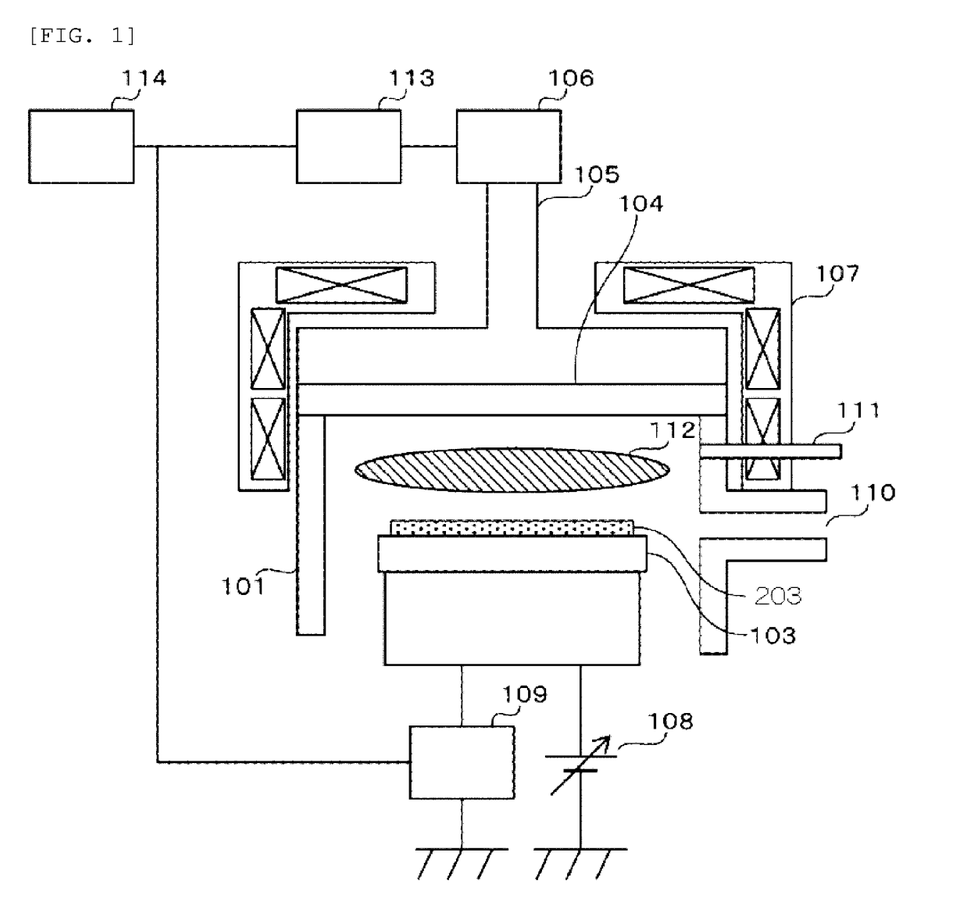
FIG. 1 is a schematic view of a plasma etching apparatus according to the present embodiment.

Hereinafter, an embodiment of the invention of the present application will be described with reference to the drawings. FIG. 1 is a cross-sectional view showing a schematic overall configuration of a plasma processing apparatus used for performing a plasma processing method according to the present embodiment.

The plasma processing apparatus includes a vacuum processing chamber 101, a lower electrode (sample stage) 103 provided in the vacuum processing chamber 101, a microwave transmitting window 104 made of quartz or the like, a waveguide 105 provided above the microwave transmitting window 104, a magnetron (plasma generator) 106, a magnetron drive power supply 113, a solenoid coil 107 provided around the vacuum processing chamber 101, an electrostatic chuck power supply 108 connected to the lower electrode 103, a substrate bias power supply 109, and a power control unit 114 used for controlling power supplied from the magnetron drive power supply 113 and the substrate bias power supply 109. The lower electrode 103 includes a wafer placing surface on which a silicon substrate 203 is held.

The magnetron drive power supply 113 supplies plasma generation power to the magnetron 106, and the substrate bias power supply 109 supplies substrate bias power to the lower electrode 103.

Further, a wafer loading port 110 is provided to carry the silicon substrate 203 into or out of the vacuum processing chamber 101, and a gas supply port 111 used for supplying gas into the vacuum processing chamber 101 is provided.

Next, an operation of the plasma processing apparatus configured as described above will be described. After an inside of the vacuum processing chamber 101 is depressurized, etching gas is supplied from the gas supply port 111 into the vacuum processing chamber 101, and the vacuum processing chamber 101 is adjusted to a desired pressure.

Subsequently, a direct voltage of several hundred volts is applied by the electrostatic chuck power supply 108, so that the silicon substrate 203 is electrostatically chucked on a placing surface of the lower electrode 103. Thereafter, when the plasma generation power is supplied from the magnetron drive power supply 113 (ON), a microwave of a frequency of 2.45 GHz is oscillated from the magnetron 106. The microwave is propagated into the vacuum processing chamber 101 through the waveguide 105. When the plasma generation power is not supplied (OFF), the magnetron 106 stops the oscillation of the microwave.

A magnetic field is generated by the solenoid coil 107 in the vacuum processing chamber 101, and plasma 112 of high-density is generated in the vacuum processing chamber 101 by an interaction between the magnetic field and the oscillated microwave.

After the plasma 112 is generated, radio frequency power is supplied from the substrate bias power supply 109 to the lower electrode 103, and the silicon substrate 203 can be subjected to etching processing by controlling an energy at which ions in the plasma are incident on a wafer.

Then, pulsed plasma can be generated by pulse-modulating the power supplied to the magnetron 106. More specifically, when the plasma generation power is turned ON/OFF at a duty ratio of more than 0% and less than 100%, an electron density, an electron temperature and a radical density at the time of generating the plasma are higher than during steady discharge. The plasma generated at this time is referred to as the pulsed plasma.

An output of the substrate bias power supply 109 can also be pulse-modulated so as to apply pulse-modulated power to the lower electrode 103. The plasma generation power or the substrate bias power is controlled by the power control unit 114.

Here, the duty ratio refers to a ratio of an ON time with respect to an ON/OFF total time of the power.

According to specification conditions, the duty ratio of the plasma generation power can be appropriately changed within a range of 15% to 40%, and the duty ratio of the substrate bias power can be appropriately changed within a range of 5% to 40%. However, only when the plasma generation power is ON, the substrate bias power is controlled to be turned ON.

Figure 2:
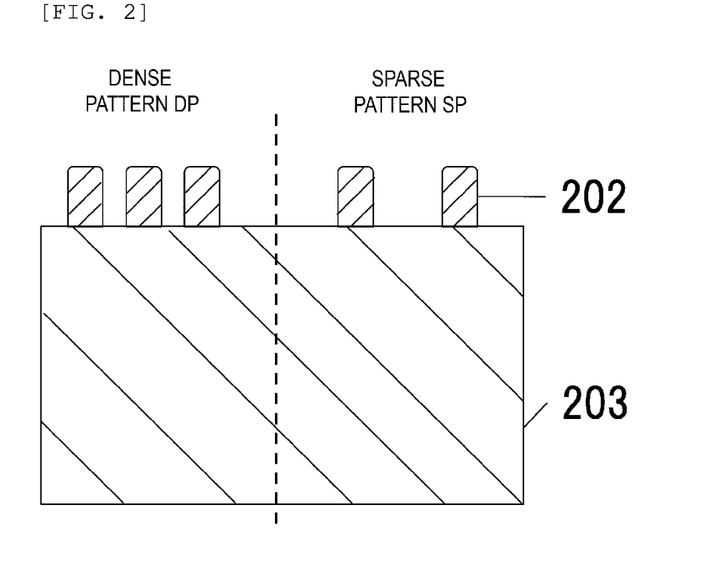
FIG. 2 is a cross-sectional view of a main part of a semiconductor substrate for explaining a semiconductor manufacturing process according to the present embodiment.

An embodiment of an STI plasma processing method using the plasma processing apparatus will be described below with reference to FIGS. 2 to 8. As shown in FIG. 2, as an initial structure, a hard mask 202 is formed on the silicon substrate 203. The hard mask 202 includes a dense pattern DP patterned at a predetermined interval and a sparse pattern SP patterned at an interval wider than the interval of the dense portion pattern DP. The interval between adjacent hard masks 202 in the dense pattern DP is 20 nm or less, for example, about 10 nm.

Figure 3:
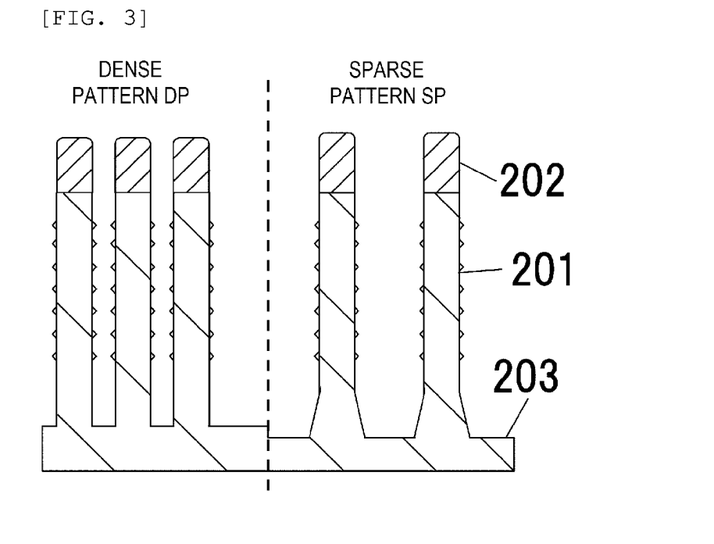
FIG. 3 is a cross-sectional view of a main part of a same part as shown in FIG. 2 during the semiconductor manufacturing process according to the present embodiment.

A shape of the silicon substrate 203 on which a Fin is formed by plasma processing is shown in FIG. 3. A process of forming the Fin is as follows.

Figure 8:
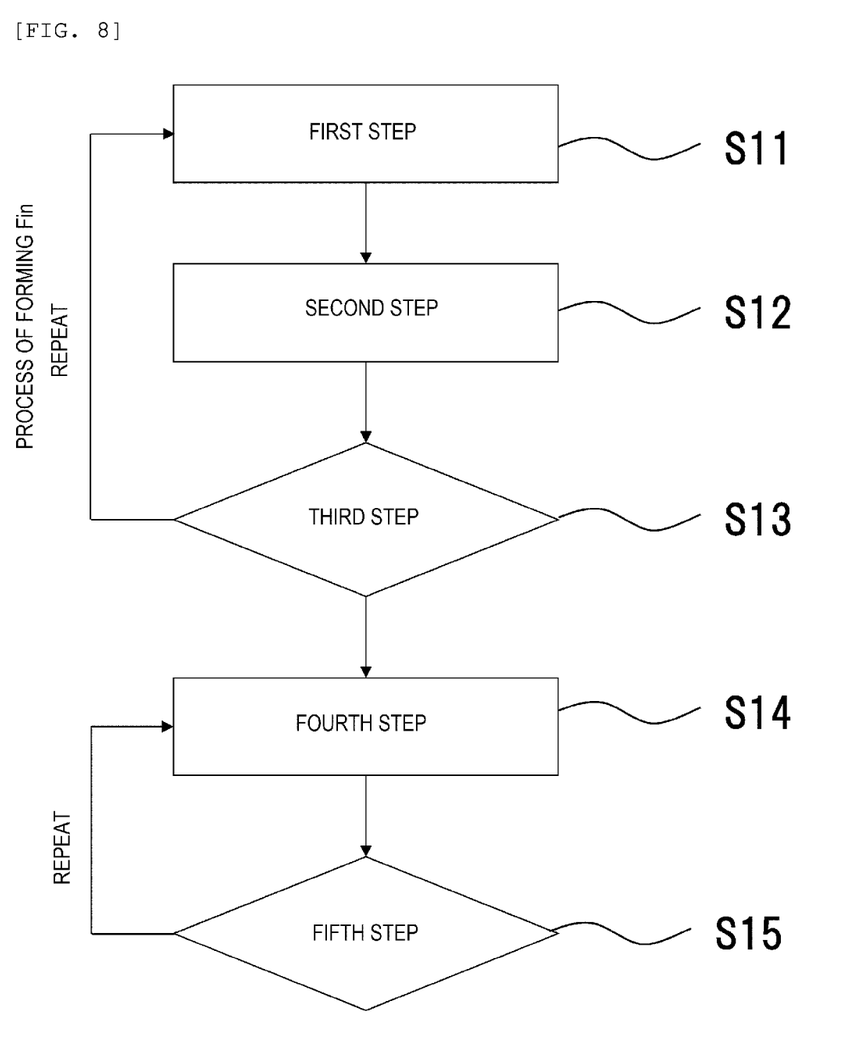
FIG. 8 is a flowchart of the semiconductor manufacturing process according to the present embodiment.

(1) The silicon substrate 203 is etched under a process condition in which $Cl_2$ gas is supplied into the vacuum processing chamber 101 such that a pressure is 0.4 Pa or less, and a duty ratio of the plasma generation power for forming the pulsed plasma is set to 40% or less (first step, step S11 in FIG. 8).

(2) Mixed gas of $SF_6$ and $CHF_3$ is supplied into the vacuum processing chamber 101 to perform vertical processing on the silicon substrate 203 (second step, step S12 in FIG. 8). Here, the vertical processing refers to a process of processing substantially vertically to a surface of the silicon substrate 203.

(3) $O_2$ gas is supplied into the vacuum processing chamber 101, and the surface of the silicon substrate 203 is oxidized under a process condition in which the power of the substrate bias power supply is 5 W or less, and a processing time is 10 seconds or less (third step, step S13 in FIG. 8).

(4) The first step to the third step are repeated a plurality of times, and the etching processing is performed until a trench depth is 40 nm or more. The process of repeating the first step to the third step a plurality of times is referred to as a fin forming process of forming the fin of the fin FET.

In the present embodiment, the etching processing is repeated seven times from the first step to the third step, so that the trench depth is set to 65 nm. The Fin is formed between the trenches formed in parallel.

In the present embodiment, the etching processing is performed until the trench depth is 65 nm, but the etching processing is not limited thereto, and the etching processing may be performed to a predetermined depth capable of forming the Fin.

Further, after the formation of the Fin, a difference in the trench depth due to the sparse and dense micro-loading is 25 nm, but the roughness did not occur on the silicon side wall 201. In a process of forming a next STI, the plasma etching processing for reducing the sparse and dense micro-loading is performed.

As the plasma etching processing method of the present embodiment, after the fin forming process, a fourth step (trench forming step) using pulsed plasma and $Cl_2$ gas, and a fifth step (oxidation step) using only plasma and $O_2$ gas by continuous discharge are further repeatedly performed. Therefore, the etching processing can be performed without generating roughness on the silicon side wall 201 constituting the Fin.

More specifically, a process of forming the STI will be described. Table 1 summarizes and shows an example of processing conditions for the fourth step and the fifth step in the present embodiment.

TABLE 1

| Step | Flow rate of gas | | | | Pressure | Plasma generation power | | Substrate bias power | |
|---|---|---|---|---|---|---|---|---|---|
| | Ar | $CH_4$ | $O_2$ | $Cl_2$ | | Value of power | Duty ratio | Value of power | Duty ratio |
| | (mL/min) | | | | (Pa) | (W) | (%) | (W) | (%) |
| 4 | 30 | 4 | — | 100 | 0.1 | 800 | 40 | 400 | 25 |
| 5 | — | — | 100 | — | 0.8 | 900 | 100 | 5 | 100 |

Figure 5:
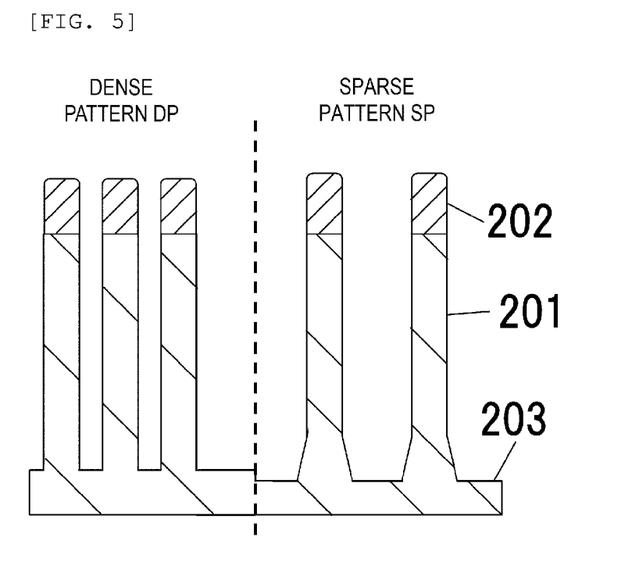
FIG. 5 is a cross-sectional view of a main part of the same part as shown in FIG. 2 during the semiconductor manufacturing process according to the present embodiment.

First, as shown in FIG. 5, a trench is formed in the silicon substrate 203 by etching using the hard mask 202 in the fourth step (step S14 in FIG. 8). As the processing conditions, it is preferable that $Cl_2$ gas is used, a flow rate of the $Cl_2$ gas is 200 ml/min or less, and a pressure is 0.3 Pa or less. Typically, the flow rate of the $Cl_2$ gas is set to 100 ml/min, a flow rate of Ar gas is set to 30 ml/min, $CH_4$ gas is set to 4 ml/min or less, and the pressure is set to 0.1 Pa.

The fourth step is preferably performed while supplying the pulse-modulated radio frequency power to the lower electrode 103 on which the silicon substrate 203 is placed. It is preferable that the duty ratio of the pulse-modulated radio frequency power for generating plasma is larger than the duty ratio of the pulse-modulated radio frequency power supplied to the lower electrode 103.

Although the Ar gas is used in the present embodiment, the Ar gas may be replaced with He gas or may be appropriately mixed therewith, and the same effect as in the case of using the Ar gas alone can be obtained.

Here, the plasma generation power is set to 800 W, the duty ratio thereof is set to 40%, the substrate bias power is set to 400 W, the duty ratio thereof is set to 25%, and the plasma generation power and the substrate bias power are synchronized by dual time modulation (Dual TM) for pulse modulation.

In addition, in the fourth step, deposition of deposits on the hard mask 202 can be prevented by performing the pulse modulation using Dual TM. In addition, the gas pressure is lowered to reduce a reaction product during the etching, and a deposit deposited on the hard mask 202 is further reduced.

Therefore, a step of removing the silicon-based reaction product as the second step in the technique of related art is not required, and the roughness of the Fin can be reduced. Further, if the processing time of the fourth step is too long, the etching of the sparse pattern SP is likely to proceed and the sparse and dense micro-loading is deteriorated, and therefore, the processing time of the fourth step is 8 seconds.

Figure 6:
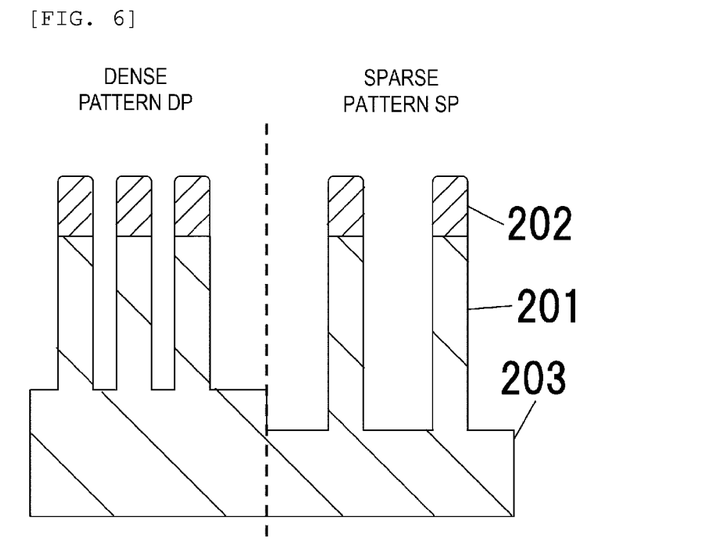
FIG. 6 is a cross-sectional view of a main part of the same part as shown in FIG. 2 during the semiconductor manufacturing process according to the present embodiment.

Next, as shown in FIG. 6, in the fifth step (step S15 in FIG. 8), an oxide portion 204 is formed on the side surfaces and an upper surface of the hard mask 202 and a silicon surface. By providing the oxide portion 204, when the fourth step is repeatedly performed thereafter and when the silicon substrate 203 is further etched in a depth direction, the side surfaces of the hard mask 202 and the silicon side wall 201 can be prevented from being etched.

As the processing conditions of the fifth step, only $O_2$ gas is used, and the plasma is generated with a continuous wave of the plasma generation power of 900 W, and the plasma processing is performed while applying a continuous wave of the substrate bias power of 5 W. By applying the substrate bias power, the silicon side wall 201 of the dense pattern DP is easily oxidized, so that generation of roughness is prevented. However, when the continuous wave of the substrate bias power of 10 W or more is applied, since the etching in the depth direction is prevented, the sparse and dense micro-loading is deteriorated. Therefore, the substrate bias power has a continuous wave of 5 W.

The fifth step is preferably performed while the unmodulated radio frequency power is supplied to the lower electrode 103.

In the fifth step, the flow rate of $O_2$ gas is large, the processing time is long, and the silicon surface exposed in the region of the dense pattern DP is excessively oxidized, and thus, when the fourth step is repeatedly performed thereafter, the etching of the silicon substrate 203 is inhibited. Further, if the pressure is too low, the silicon surface exposed in the sparse pattern SP is unlikely to be oxidized, so that the etching in the depth direction cannot be prevented, which causes deterioration of the sparse and dense micro-loading. Therefore, the gas flow rate of $O_2$ is 100 ml/min or less, the pressure is 0.8 Pa or less, and the processing time is 7 seconds.

In the present embodiment, the processing time of the fourth step is 8 seconds, and the processing time of the fifth step is 7 seconds. However, if any one of the processing times is too long, the sparse and dense micro-loading is deteriorated. Therefore, it is preferable that the processing time of the fourth step and the fifth step is within 10 seconds, so that the same effect is obtained.

Under the processing conditions shown in Table 1, the two processes described with reference to FIG. 5 (fourth step) and FIG. 6 (fifth step) are repeatedly performed to etch so as to obtain a predetermined depth. In the present embodiment, the process is repeated five times so that the trench depth is 110 nm.

Figure 7:
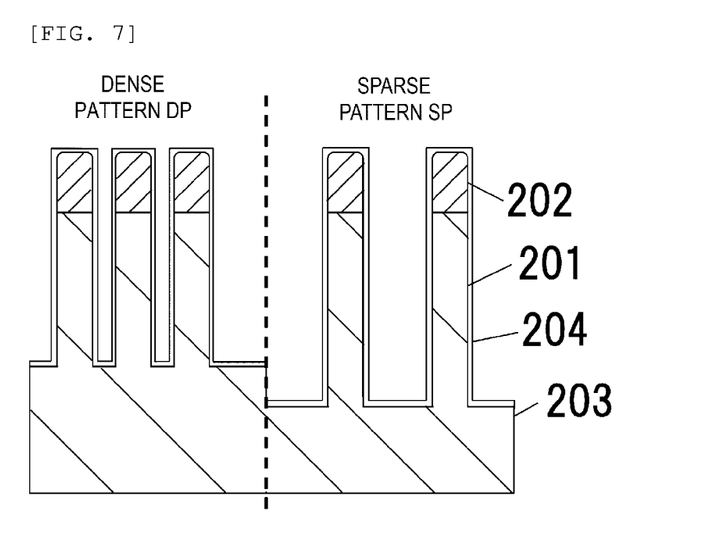
FIG. 7 is a cross-sectional view of a main part of the same part as shown in FIG. 2 during the semiconductor manufacturing process according to the present embodiment.

As shown in FIG. 7, a difference in the trench depth due to the sparse and dense micro-loading is reduced to 10 nm. In the present embodiment, the etching is performed until the trench depth is 110 nm, and the fourth step and the fifth step are preferably repeated 5 times or more, so that the etching can be performed with the trench depth being 110 nm or more.

As described above, according to the present embodiment, the reaction product during the etching in the fourth step is reduced, and the deposit is prevented by avoiding excessive protection of the silicon surface in the fifth step, so that both the reduction of the sparse and dense microloading and the reduction of the roughness on the silicon side wall of the Fin can be achieved.

The invention is not limited to the embodiment described above, and includes various modifications. For example, the embodiment described above has been described in detail for easy understanding of the invention, and is not necessarily limited to those having all the configurations described. Further, a part of the configuration of one embodiment can be replaced with the configuration of another embodiment, and the configuration of another embodiment can be added to the configuration of one embodiment. Further, a part of the configuration of each embodiment may be added, deleted, or replaced with another configuration.

REFERENCE SIGN LIST

1 . . . vacuum processing chamber, 102 . . . wafer, 103 . . . lower electrode, 104 . . . microwave transmitting window, 105 . . . waveguide, 106 . . . magnetron, 107 . . . solenoid coil, 108 . . . electrostatic chuck power supply, 109 . . . substrate bias power supply, 110 . . . wafer loading port, 111 . . . gas supply port, 112 . . . plasma, 113 . . . magnetron drive power supply, 201 . . . silicon side wall, 202 . . . hardmask, 203 . . . silicon substrate, 204 . . . oxide portion

The invention claimed is:

1. A plasma processing method for forming shallow trench isolation (STI) on a silicon substrate, the plasma processing method comprising:
    a fin forming step of forming a fin of a fin FET,
    after the fin forming step, a trench forming step of forming a trench in the silicon substrate after the fin forming step by using plasma generated by pulse-modulated radio frequency power; and
    an oxidation step of oxidizing the silicon substrate by using only oxygen gas which is performed after the trench forming step, wherein
    the trench forming step and the oxidation step are repeated a plurality of times, and
    the fin forming step comprises a first step of etching the silicon substrate by using plasma generated by pulse-modulated radio frequency power.

2. The plasma processing method according to claim 1, wherein
    the oxidation step is performed using plasma by continuous discharge.

3. The plasma processing method according to claim 1, wherein
    the trench forming step is performed while pulse-modulated radio frequency power is supplied to a sample stage on which the silicon substrate is placed.

4. The plasma processing method according to claim 2, wherein
    the trench forming step is performed while pulse-modulated radiofrequency power is supplied to a sample stage on which the silicon substrate is placed.

5. The plasma processing method according to claim 4, wherein
    a duty ratio of the pulse-modulated radio frequency power for generating the plasma is larger than a duty ratio of the pulse-modulated radio frequency power supplied to the sample stage.

6. The plasma processing method according to claim 5, wherein
    the trench forming step is performed using mixed gas of chlorine gas, methane gas, and argon gas.

7. The plasma processing method according to claim 1, wherein
    the oxidation step is performed while unmodulated radio frequency power is supplied to the sample stage.

8. The plasma processing method according to claim 1, wherein
    the fin forming step further comprises a second step of etching the silicon substrate after the first step, and a third step of oxidizing the silicon substrate by using oxygen gas, and
    the first step or the third step are repeated a plurality of times.

9. The plasma processing method according to claim 1, wherein
    the first step is performed using chlorine gas.

10. The plasma processing method according to claim 8, wherein
    the first step is performed using chlorine gas.

11. The plasma processing method according to claim 10, wherein
    the second step is performed using SF6 gas and CHF3 gas.

12. The plasma processing method according to claim 1, wherein a gas flow rate 2 is 100 ml/min or less, a pressure is 0.8 Pa or less, and a processing time is within 10 seconds during the oxidation step.

13. The plasma processing method according to claim 12, wherein the processing time for the oxidation step is 7 seconds.

14. The plasma processing method according to claim 2, wherein the continuous discharge substrate bias power is less than 10 W.

15. The plasma processing method according to claim 14, wherein the continuous discharge substrate bias power is 5 W and the continuous discharge plasma generation power during is 900 W.

16. The plasma processing method according to claim 1, wherein a processing time for the trench forming step is within 10 seconds.

17. The plasma processing method according to claim 16, wherein the processing time for the trench forming step is 8 seconds.

* * * * *